(12) United States Patent
Shiobara et al.

(10) Patent No.: US 7,794,923 B2
(45) Date of Patent: Sep. 14, 2010

(54) SUBSTRATE PROCESSING METHOD, SUBSTRATE PROCESSING APPARATUS, AND MANUFACTURING METHOD OF SEMICONDUCTOR DEVICE

(75) Inventors: Eishi Shiobara, Yokohama (JP); Kentaro Matsunaga, Kawasaki (JP); Daisuke Kawamura, Yokohama (JP); Tomoyuki Takeishi, Yokkaichi (JP); Kei Hayasaki, Kamakura (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 740 days.

(21) Appl. No.: 11/654,565

(22) Filed: Jan. 18, 2007

(65) Prior Publication Data

US 2007/0190462 A1    Aug. 16, 2007

(30) Foreign Application Priority Data

Jan. 20, 2006    (JP) .............................. 2006-013061

(51) Int. Cl.
*G03F 7/00* (2006.01)
(52) U.S. Cl. .................. 430/327; 430/311; 430/961
(58) Field of Classification Search ................. 430/311, 430/327, 961
See application file for complete search history.

(56) References Cited

U.S. PATENT DOCUMENTS 6,617,095 B2     9/2003   Kitano et al.

2006/0008746 A1   1/2006  Onishi et al.
2006/0177776 A1   8/2006  Matsunaga et al.

FOREIGN PATENT DOCUMENTS

| JP | 10-041214 A | 2/1998 |
|----|----|----|
| JP | 10-303114 | 11/1998 |
| JP | 2005-150734 | 6/2005 |
| JP | 2005-175079 | 6/2005 |
| JP | 2005-183709 | 7/2005 |
| KR | 2001-0090743 | 10/2001 |

OTHER PUBLICATIONS

Notification for Filing Opinion mailed Mar. 14, 2008 by Korean Patent Office for Korean application No. 10-2007-5952.
Notification of the First Office Action mailed Aug. 29, 2008, from the State Intellectual Property Office of the People's Republic of China for corresponding Chinese patent application No. 2007100043083, and translation thereof.

*Primary Examiner*—Kathleen Duda
(74) *Attorney, Agent, or Firm*—Finnegan, Henderson, Farabow, Garrett & Dunner, L.L.P.

(57) ABSTRACT

A substrate processing method including while a liquid is supplied between a processing target substrate to be applied with exposure treatment and a projection optical system of an exposure apparatus for carrying out the exposure treatment, prior to providing a resist film on a first main face of the processing target substrate that is provided for liquid immersion exposure for carrying out the exposure treatment at a side to be applied with the exposure treatment, selectively applying at least hydrophobic treatment with respect to a region in a predetermined range from a peripheral rim part of a second main face opposite to the first main face.

18 Claims, 6 Drawing Sheets

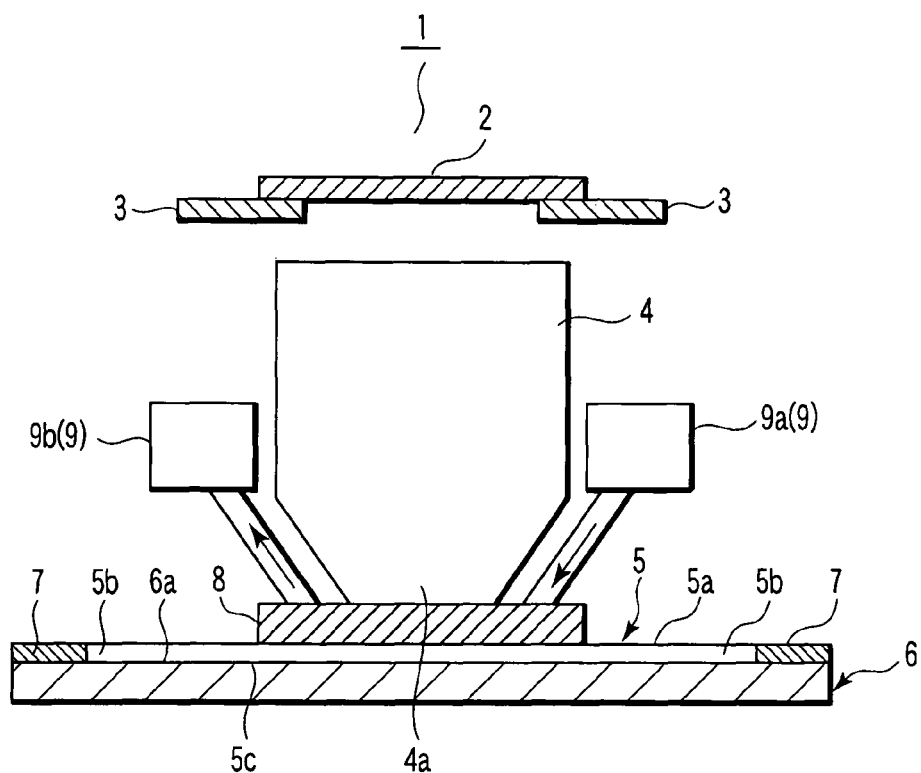
F I G. 1
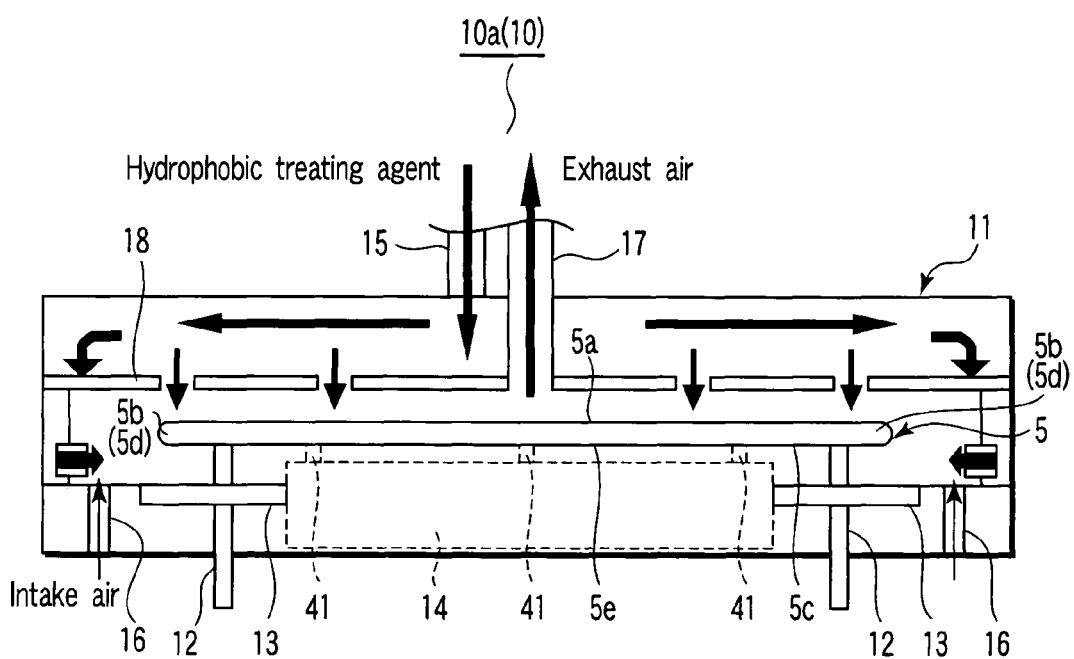
F I G. 2

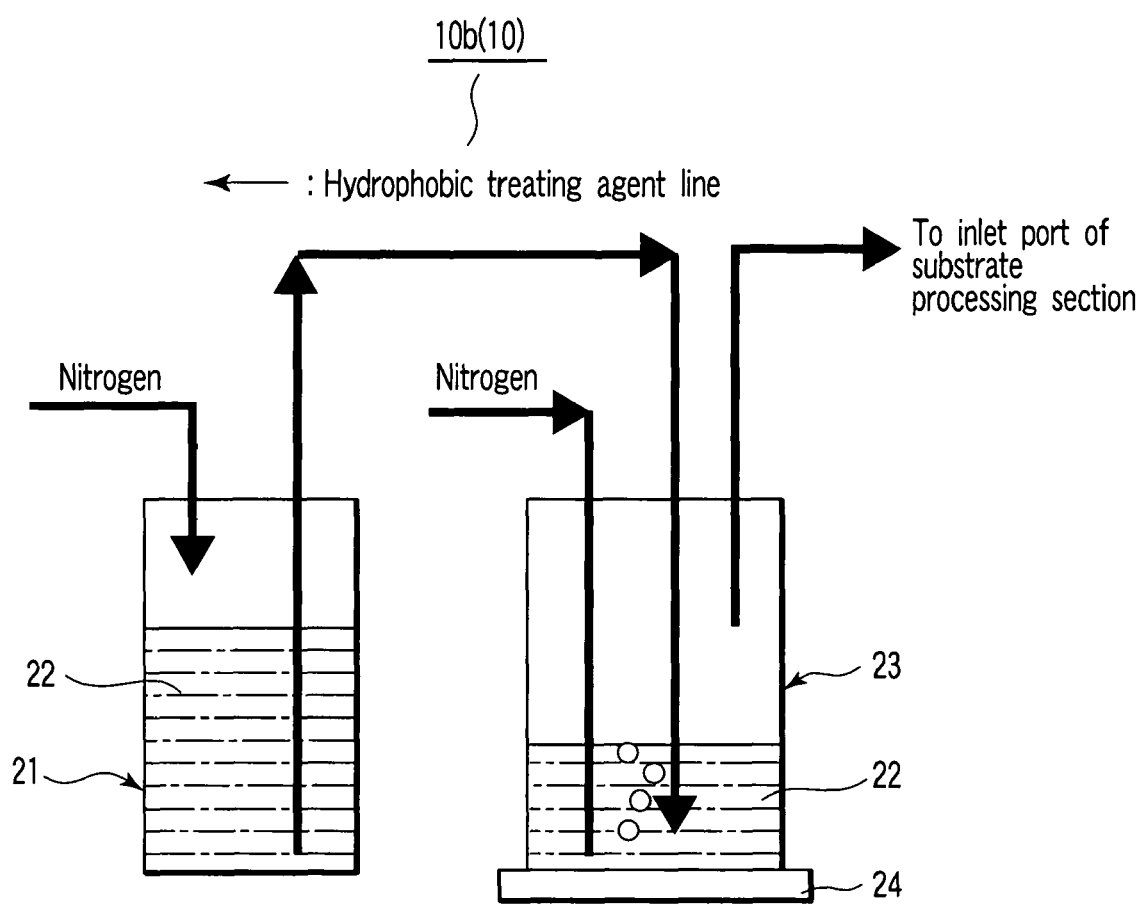
F I G. 3

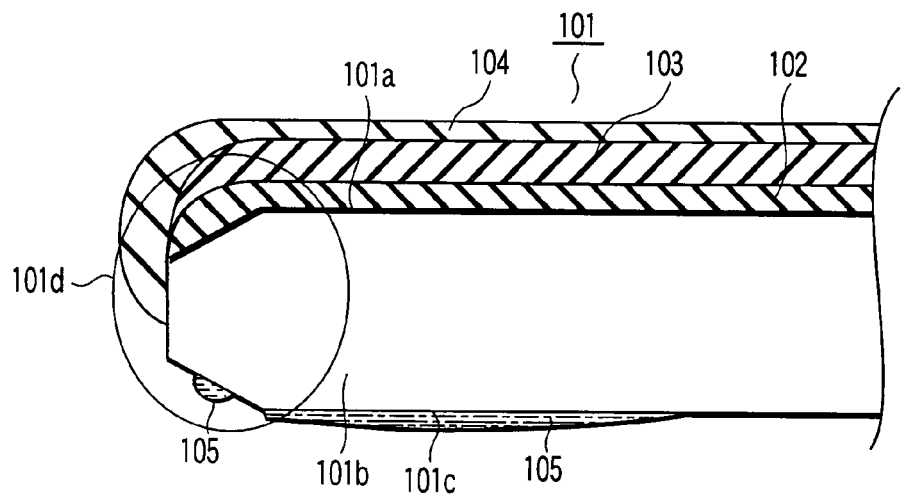
F I G. 6
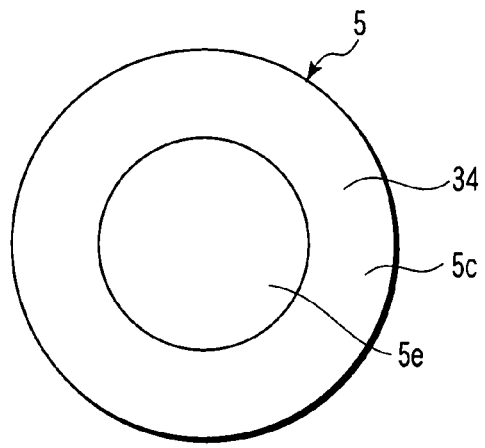
F I G. 7A
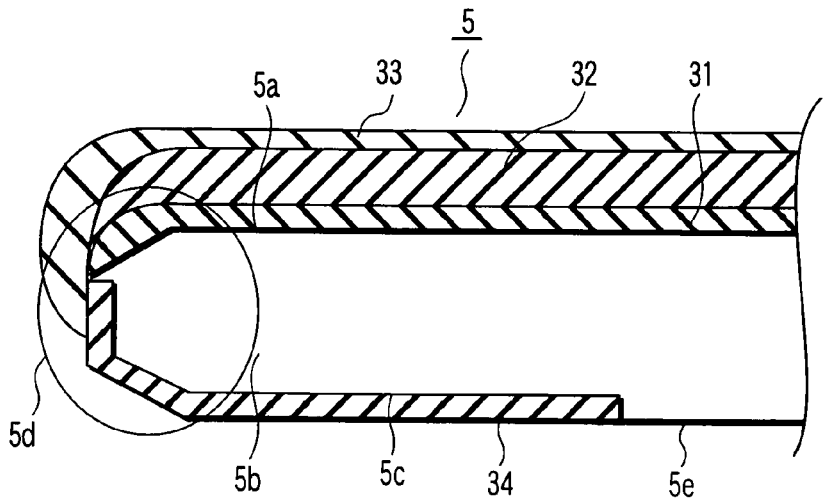
F I G. 7B

SUBSTRATE PROCESSING METHOD, SUBSTRATE PROCESSING APPARATUS, AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2006-013061, filed Jan. 20, 2006, the entire contents of which are incorporated herein by reference.

BACKGROUND OF THE INVENTION

1. Field of the Invention

The present invention relates to a substrate processing method, a substrate processing apparatus, and a manufacturing method of a semiconductor device. In particular, the present invention relates to a substrate processing method and a substrate processing apparatus for use in a liquid immersion exposure process, and a manufacturing method of a semiconductor device with using the method and the apparatus.

2. Description of the Related Art

Recently, attention has been focused on an exposure method referred to as a liquid immersion exposure method. The liquid immersion exposure method is provided as an exposure method for carrying out patterning on a resist film while a gap between a projection optical system (projection lens) of an exposure apparatus and a processing target substrate (exposure target substrate) to be applied with exposure treatment is filled with a liquid (immersion liquid) having a high refractive index. The gap between the projection optical system and the resist film is filled with an immersion liquid, whereby a deeper focal point can be obtained. Currently, pure water is generally used as an immersion liquid. A technique relating to liquid immersion exposure is disclosed in Jpn. Pat. Appln. KOKAI Publication No. 10-303114. However, if pure water exists in a resist film shape, there is a danger that a photoacid generator agent or the like is eluted from the inside of the resist film into the pure water. If the photoacid generator agent is eluted from the inside of the resist film into the pure water, it becomes difficult to properly pattern the resist film. In order to avoid such a problem, there is proposed a technique of further providing a cover film on the resist film.

In a general exposure target substrate (wafer), its peripheral rim part is formed in an inclined shape such that the thickness becomes smaller as it goes from a radial inside to a radial outside of the wafer. Of the peripheral rim part of the wafer, a portion having an inclination is referred to as a bevel portion. Of course, the pure water on the wafer is likely to leak from the bevel portion to the outside of the wafer. If the pure water leaks out from the top of the wafer, it becomes difficult to properly carry out liquid immersion exposure. Therefore, in order to prevent the pure water from leaking out from the bevel portion at the time of liquid immersion exposure, it is desirable to cover a region from a center part of the wafer up to the outer face of the peripheral rim part with the cover film.

However, in a general liquid immersion type exposure apparatus, a slight gap always exists between a wafer and a wafer stage on which the wafer is placed. For this reason, it is very difficult to completely restrict liquid leakage from the bevel portion. In addition, there is a high danger that the liquid leakage from the bevel portion causes a problem that pure water goes around the back face side of the wafer. In a state in which the pure water goes around the back face side of the wafer and the back face side remains wet, which leads contamination of the wafer stage of the exposure apparatus and quality deterioration of wafers to be processed later. Finally, in a semiconductor device manufactured by using such a wafer whose quality deteriorates, there is a high danger that its performance, quality, reliability or the like deteriorates.

BRIEF SUMMARY OF THE INVENTION

According to an aspect of the invention, there is provided a substrate processing method comprising:

while a liquid is supplied between a processing target substrate to be applied with exposure treatment and a projection optical system of an exposure apparatus for carrying out the exposure treatment, prior to providing a resist film on a first main face of the processing target substrate that is provided for liquid immersion exposure for carrying out the exposure treatment at a side to be applied with the exposure treatment, selectively applying at least hydrophobic treatment with respect to a region in a predetermined range from a peripheral rim part of a second main face opposite to the first main face.

According to another aspect of the invention, there is provided a substrate processing apparatus comprising: a substrate housing chamber in which a processing target substrate to be applied with exposure treatment is housed prior to providing a resist film on a first main face at a side at which the exposure treatment is applied; a substrate support unit which exposes a region in a predetermined range from a peripheral rim part of a second main face opposite to at least the first main face in the substrate housing chamber, and supports the processing target substrate; and a substrate treating agent supply device which supplies a hydrophobic treating agent into the substrate housing chamber.

According to still another aspect of the invention, there is provided a manufacturing method of a semiconductor device wherein the method including a liquid immersion exposure method for carrying out exposure treatment while supplying a liquid between a processing target substrate to be applied with the exposure treatment and a projection optical system of an exposure device for carrying out the exposure treatment, comprising: providing a resist film on which a predetermined resist pattern is formed by the exposure treatment on a first main face of the processing target substrate at a side to be applied with the exposure treatment; providing a cover film on the resist film; and selectively applying the exposure treatment via a mask to the processing target substrate having the cover film provided thereon, and prior to providing the resist film on the first main face, selectively applying at least hydrophobic treatment to a region in a predetermined range from a peripheral rim part of a second main face opposite to the first main face of the processing target substrate.

According to yet another aspect of the invention, there is provided a manufacturing method of a semiconductor device wherein the method including a liquid immersion exposure method for carrying out exposure treatment while supplying a liquid between a processing target substrate to be applied with the exposure treatment and a projection optical system of an exposure device for carrying out the exposure treatment, comprising: providing a resist film on which a predetermined resist pattern is formed by the exposure treatment on a first main face of the processing target substrate at a side to be applied with the exposure treatment; providing a cover film on the resist film; and selectively applying the exposure treatment via a mask to the processing target substrate having the cover film provided thereon, and prior to providing the resist film on the first main face, selectively applying at least hydrophobic treatment to a region in a predetermined range from a peripheral rim part of a second main face opposite to the first main face of the processing target substrate by use of a substrate processing apparatus, the substrate processing apparatus comprising: a substrate housing chamber in which a processing target substrate to be applied with exposure treatment is housed prior to providing a resist film on a first face at a side to be applied with the exposure; a substrate support unit which exposes a region in a predetermined range from a peripheral rim part of a second main face opposite to at least the first main face in the substrate housing chamber, and supports the processing target substrate; and a substrate treating agent supply device which supplies a hydrophobic treating agent into the substrate housing chamber.

BRIEF DESCRIPTION OF THE SEVERAL VIEWS OF THE DRAWINGS

FIG. 1 is a view schematically depicting a general configuration of a liquid immersion type exposure apparatus according to a first embodiment;

FIG. 2 is a view schematically depicting a general configuration of a substrate processing section of a substrate processing apparatus according to the first embodiment;

FIG. 3 is a view schematically depicting a general configuration of a substrate treating agent supply section of the substrate processing apparatus according to the first embodiment;

FIG. 6 is a sectional view showing a substrate according to Comparative Example against the first embodiment;

FIG. 7A is a plan view showing a substrate applied with substrate processing according to a second embodiment, as seen from the back side;

FIG. 7B is a sectional view showing the substrate applied with substrate processing according to the second embodiment.

DETAILED DESCRIPTION OF THE INVENTION

Now, embodiments according to the present invention will be described with reference to the accompanying drawings.

First Embodiment

Figure 4:
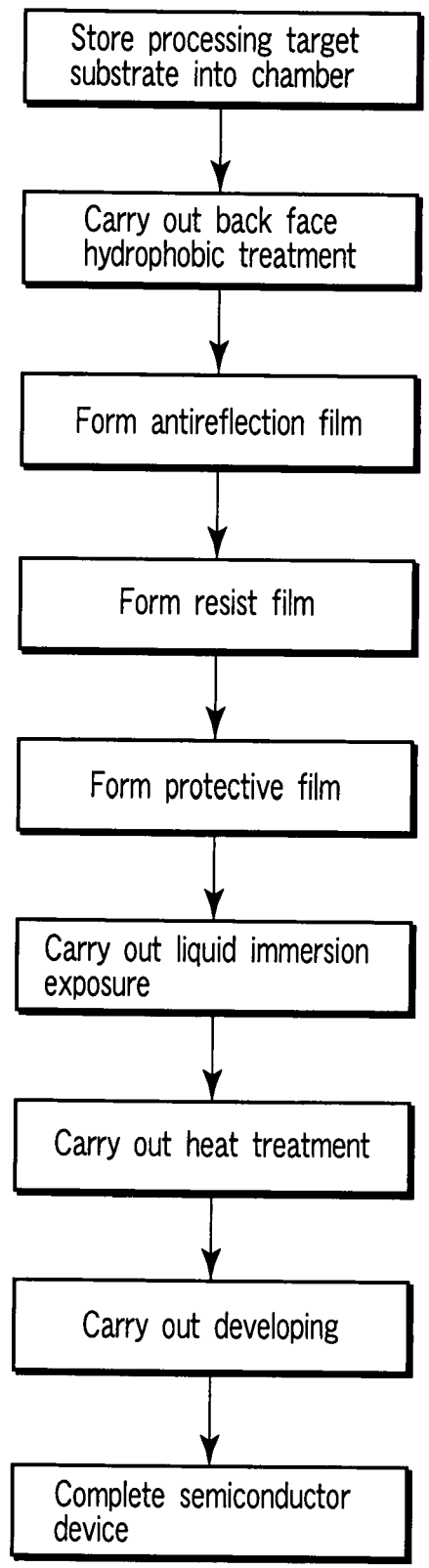
FIG. 4 is a flow chart showing a substrate processing method according to the first embodiment.
Figure 5A:
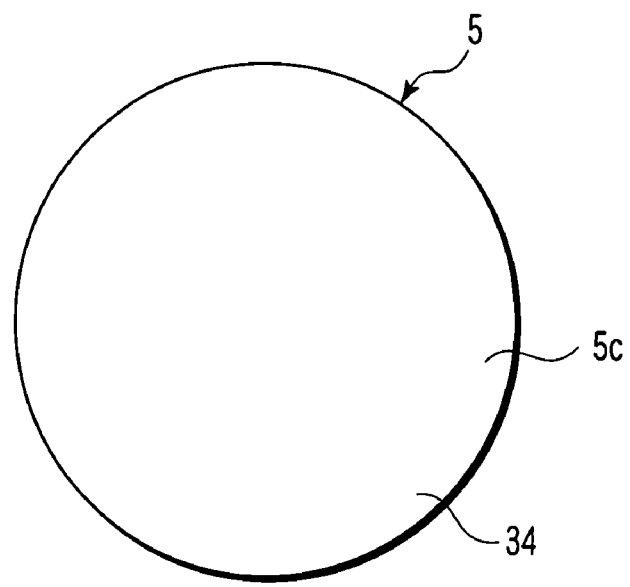
FIG. 5A is a plan view showing a substrate applied with substrate processing according to the first embodiment, as seen from the back side.
Figure 5B:
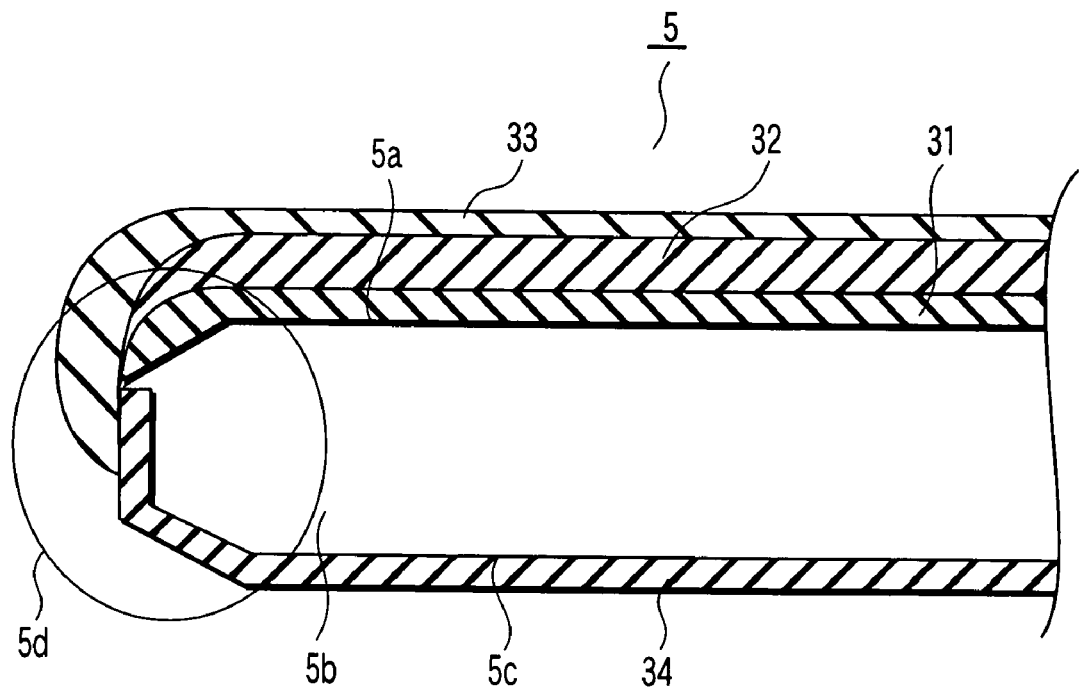
FIG. 5B is a sectional view showing the substrate applied with substrate processing according to the first embodiment.

First, a first embodiment according to the present invention will be described with reference to FIGS. 1 to 5B. FIG. 1 is a view schematically depicting a general configuration of a liquid immersion type exposure apparatus according to the first embodiment. FIG. 2 is a view schematically depicting a general configuration of a substrate processing section of a substrate processing apparatus according to the first embodiment. FIG. 3 is a view schematically depicting a general configuration of a substrate treating agent supply section of the substrate processing apparatus according to the first embodiment. FIG. 4 is a flow chart showing a substrate processing method according to the first embodiment. FIG. 5A is a plan view showing a substrate applied with substrate processing according to the first embodiment, as seen from the back side. FIG. 5B is a sectional view showing the substrate applied with substrate processing according to the first embodiment.

In the present embodiment, prior to providing a resist film on a main face of a processing target substrate to be applied with exposure treatment at a side to be applied with exposure treatment, hydrophobic treatment is applied to a main face opposite to the main at the side to be applied with exposure treatment. Now, a specific and detailed description will be given below.

First, with reference to FIG. 1, a liquid immersion type exposure apparatus 1 according to the embodiment will be given below. The liquid immersion type exposure apparatus 1 shown in FIG. 1 is one kind of liquid immersion type exposure apparatus referred to as a so-called scan type.

As shown in FIG. 1, the liquid immersion type exposure apparatus 1 is equipped with a reticle stage 3 serving as a reticle support unit for supporting a reticle 2. In addition, although not shown, the liquid immersion type exposure apparatus 1 is equipped with an exposure light source (illumination light source) for generating exposure light (illumination light) and an illumination lens system (illumination optical system) for guiding the illumination light generated by the illumination light source to the reticle 2. The reticle stage 3 is arranged below an optical path of the illumination light source and the illumination lens system. Concurrently, the reticle stage 3 is set to be movable in a parallel forward direction or in a parallel opposite direction along a direction orthogonal to an optical axis of the liquid immersion type exposure apparatus 1. The reticle 2 is provided on a main face (surface, top face) at a side opposite to the illumination light source and the illumination lens system of the reticle stage 3. In addition, although not shown, at least one pattern (mask pattern) having a predetermined shape formed to be exposed on a surface 5a of an exposure target substrate 5 is formed on the reticle 2.

In addition, the liquid immersion type exposure apparatus 1 is equipped with a projection lens system (projection optical system) 4 for guiding the exposure light having passed through (having transmitted) the reticle 2 to the surface 5a of the exposure target substrate 5. The projection lens system 4 is disposed downwardly of an optical path of the reticle stage 3.

In addition, the liquid immersion type exposure apparatus 1 is equipped with an exposure target substrate stage (wafer stage) 6 serving as an exposure target substrate support element (wafer support element) for supporting the exposure target substrate (wafer, semiconductor substrate) 5 applied with exposure processing. The wafer stage 6 is disposed downwardly of an optical path of the projection lens system 4. In addition, the wafer stage 6 is set to be movable in a parallel forward direction or in a parallel opposite direction together with the wafer 5 along a direction orthogonal to an optical axis of the liquid immersion type exposure apparatus 1, as in the reticle stage 3. In this manner, the wafer stage 6 and the wafer 5 placed (mounted) on the wafer stage 6 can relatively move with respect to the projection lens system 4. In addition, from an opposite point of view, the projection lens system 4 can relatively move with respect to the wafer stage 6 and the wafer 5 placed on the wafer stage 6. The wafer 5 is placed on a main face (surface, top face) of a side opposite to the projection lens system 4 of the wafer stage 6.

In addition, on a surface of the wafer stage 6, there is provided a support plate (support member) 7 serving as an exposure target substrate holding element (wafer holding element) for holding the wafer 5 so as not to be displaced when the wafer 5 moves together with the wafer stage 6. The support plate 7 is provided to surround a peripheral rim part (outer rim part) 5b of the wafer 5.

In addition, at a distal end part 4a of the projection lens system 4, there is provided a fence 8 serving as a liquid holding element (immersion liquid holding element) for holding a liquid (immersion liquid) for exposure processing supplied between the projection lens system 4 and the wafer 5, in a desired region on the surface 5a of the wafer 5. In addition, laterally of the projection lens system 4, there is provided a liquid supply/discharge device (immersion liquid supply/discharge device) 9 consisting of a liquid supply device 9a for supplying a liquid into the fence 8 and a liquid discharge device 9b for discharging a liquid from the inside of the fence 8. In the present embodiment, the apparatus is set such that a liquid is supplied into the fence 8 from the liquid supply device 9a disposed at the right side of the projection lens system 4 shown in FIG. 1. In addition, the apparatus is set such that a liquid is discharged from the inside of the fence 8 by means of the liquid discharge device 9b disposed at the left side of the projection lens system 4. In the present embodiment, as an immersion liquid (first chemical), as in a general liquid immersion exposure process, pure water is used. Therefore, the liquid supply/discharge device 9 is also merely referred to as a water supply/discharge device. Similarly, the liquid supply device 9a and the liquid discharge device 9b each are merely referred to as a water supply device 9a and a water discharge device 9b.

With such settings, at least at the time of carrying out liquid immersion exposure, a space enclosed by the fence 8 between the distal end part 4a of the projection lens system 4 and the surface 5a of the wafer 5 is filled with a liquid film (water film) made of pure water. A region filled with the water film between the projection lens system 4 and the wafer 5 is also referred to as a liquid immersion region. Concurrently, the distal end part 4a of the projection lens system 4 is also referred to as a liquid immersion head. In FIG. 1, liquid immersion is not shown in order to clarify drawings.

Further, although not shown, at the side of the projection lens system 4, there is provided an alignment mark detecting device for detecting an alignment mark. In this alignment mark detecting device as well, as in the projection lens system 4, the wafer stage 6 relatively moves with respect to the projection lens system 4, whereby the detecting device can relatively move with respect to the wafer stage 6 and the wafer 5. Alignment mark detection is carried out prior to applying liquid immersion exposure processing to the wafer 5, in order to enhance exposure precision.

Although not shown, the illumination light emitted from the illumination light source arrives at the reticle 2 through the illumination lens system. The illumination light having arrived at the reticle 2 passes through a mask pattern formed on the reticle 2, whereby the mask pattern is molded into a predetermined shape. Then, the illumination light (exposure light) formed in the predetermined pattern shape is incident to the projection lens system 4. The exposure light incident to the projection lens system 4 is emitted from the distal end part (liquid immersion head) 4a of the projection lens system 4, and then, passes through the liquid immersion region and arrives at a desired irradiation region (exposure region) set on the surface 5a of the wafer 5. In more detail, a mask pattern image is exposed and projected onto a surface of a photo resist (not shown) provided on the surface 5a of the wafer 5, and a mask pattern latent image is formed therein. That is, liquid immersion exposure processing is applied to the surface 5a of the wafer 5.

Now, with reference to FIGS. 2 and 3, a substrate processing apparatus 10 according to the present embodiment will be described here. The substrate processing apparatus 10 is composed of a substrate processing section 10a and a substrate treating agent supply section 10b.

First, with reference to FIG. 2, the substrate processing section 10a will be described here. The substrate processing section 10a is specifically provided as a hydrophobic treatment section which applies hydrophobic treatment to the wafer 5.

As shown in FIG. 2, the hydrophobic treatment section 10a is equipped with a chamber 11 serving as a substrate housing chamber for housing the wafer 5. The wafer 5 is housed in the chamber 11 prior to providing a resist film 32 described later on the surface 5a that is a first main face at a side to be applied with exposure treatment. In the chamber 11, there are provided a plurality of pins 12 serving as a substrate support unit for exposing and supporting a region in a predetermined range from at least a peripheral rim part 5b of the wafer 5, of a back face 5c that is a second main face opposite to the surface 5a of the wafer 5. In the present embodiment, three pins 12 are concentrically installed. In FIG. 2, however, only two of the three pins 12 are shown in order to clarify drawings. The wafer 5 is placed on each of the pins 12 with its back face 5c oriented downward.

In the chamber 11, a hot plate (heating device) 13 for heating the wafer 5 from the side of the back face 5c is installed at a position opposite to the back face 5c of the wafer 5 placed on each of the pins 12. The hot plate 13 can heat the wafer 5 such that a temperature of the back face 5c is in the range of about 80° C. or more and 200° C. or less.

As indicated by the dashed line shown in FIG. 2, a configuration may be provided such that a hydrophobic treating agent shielding mechanism 14 is installed at a position that covers a center part of the back face 5c of the wafer 5 at a side opposite to the back face 5c of the wafer 5 placed on each of the pins 12. A technique of utilizing the hydrophobic treating agent shielding mechanism 14 will be described in a second embodiment described later.

A hydrophobic treating agent inlet port 15 and an intake port 16 are formed in the chamber. The hydrophobic treating agent inlet port 15 introduces into the chamber 11 the hydrophobic treating agent supplied from the substrate treating agent supply section 10b described later, and the intake port 16 introduces an inert gas such as air or nitrogen into the chamber 11. The chamber 11 also has an exhaust port 17 for discharging the hydrophobic treating agent, air, and various inert gases introduced into the chamber 11 to the outside of the chamber 11. Further, a diffusion plate 18 is provided at an upper part of the chamber 11. The diffusion plate 18 substantially uniformly diffuses in the chamber 11 the atmosphere introduced into the chamber 11. Although not shown, a pump is provided at a secondary side (outside, downstream side) of the exhaust port 17, the inside of the substrate housing chamber is vacuum-drawn, whereby a design may be made to increase discharge efficiency.

In FIG. 2, the hydrophobic treating agent inlet port 15 is formed at the upper part of the chamber 11 and a design is made such that an atmosphere such as a hydrophobic treating agent is introduced through the surface (top face) 5a and the side face of the wafer 5. However, a position of the hydrophobic treating agent inlet port 15 is not limited to the position shown in FIG. 2. The hydrophobic treating agent inlet port 15 may be formed at a position at which charge efficiency of the hydrophobic treating agent into the chamber 11 is good. Such a design also applies to the intake port 16 and the exhaust port 17. The intake port 16 may be formed at a position at which displacement efficiency of the hydrophobic treating agent in the chamber with the inert gas is good. In addition, the exhaust port 17 may be provided at a position at which discharge efficiency of the hydrophobic treating agent from the inside of the chamber 11 to the outside of the chamber 11 is good.

Now, with reference to FIG. 3, a description will be given with respect to the substrate treating agent supply section 10b of the substrate processing apparatus 10 according to the embodiment.

The substrate treating agent supply section 10b is specifically provided as a hydrophobic treating agent supply device for supplying a hydrophobic treating agent into the chamber 11 of the hydrophobic treatment section 10a described previously. The hydrophobic treating agent supply device 10b includes a chemical supply section 21 supplied with a chemical 22 of a hydrophobic treating agent and a hydrophobic atmosphere producing section 2 for producing an atmosphere including the hydrophobic treating agent. As shown in FIG. 3, the chemical 22 of the hydrophobic treating agent is supplied to, and is stored in, the chemical supply section 21. Thus, the chemical supply section 21 is also referred to as a chemical bottle (hydrophobic treating agent bottle).

The hydrophobic treating agent 22 contained in the chemical bottle 21 is temporarily fed to the hydrophobic atmosphere producing agent 23 in accordance with a method such as nitrogen pressure feed for blowing nitrogen into the chemical bottle 21. Nitrogen is introduced into the hydrophobic atmosphere producing section 23 supplied with the hydrophobic treating agent 22. At this time, the nitrogen is blown into the inside of the hydrophobic treating agent 22. It is desirable that the nitrogen introduced into the hydrophobic atmosphere producing section 23 is nitrogen with high purity. With such a design, an atmosphere including the hydrophobic treating agent 22 is produced while bubbling is carried out in the hydrophobic atmosphere producing portion 23. Thus, the hydrophobic atmosphere producing section 23 is also referred to as a bubbling section or a bubbling container.

A weight sensor 24 for sensing a capacity (weight) of the hydrophobic treating agent 22 contained in the bubbling container 23 is installed at a bottom part (lower part) of the bubbling portion 23. In the case where the hydrophobic treating agent 22 contained in the bubbling container 23 becomes equal to or smaller than a predetermined quantity, the fact is sensed by the weight sensor 24, and is notified to a control device (not shown). The control device having received this notification is designed to actuate a pump or the like (not shown) to automatically supply the chemical 22 from the chemical bottle (hydrophobic treating agent bottle) 21 into the bubbling container 23 until a predetermined quantity has been reached.

The hydrophobic atmosphere produced at the bubbling portion 23 is pressure-fed to the hydrophobic treating agent inlet port (hydrophobic atmosphere inlet port) 15 provided in the chamber 11 of the hydrophobic treatment section 10a described previously. The pressure-fed hydrophobic atmosphere is introduced into the chamber 11 through the hydrophobic atmosphere inlet port 15.

As described above, the substrate processing apparatus 10 according to the embodiment is specifically provided as a hydrophobic treatment apparatus for applying hydrophobic treatment to the wafer 5, the apparatus including the hydrophobic treatment section 10a and the hydrophobic treating agent supply device 10b.

Now, with reference to FIG. 4, a description will be given with respect to a substrate processing method according to the present embodiment. The substrate processing method according to the embodiment is specifically provided as a hydrophobic treatment method of a wafer 5.

First, as shown in FIG. 4, a wafer 5 having a diameter of about 300 mm on which a resist film 32 or the like is not provided, is housed in the above-described chamber 11. At this time, the wafer 5 is placed on each pin 12 such that its surface 5a is oriented upward and its back face 5c is oriented downward. The wafer 5 is formed in an inclined shape such that the thickness is reduced as its peripheral part 5b goes from the radial inside to the radial outside of the wafer 5. Of the peripheral rim part 5b of the wafer 5, a portion having such an inclination is provided is referred to as a bevel portion 5d. In the embodiment, the wafer 5 is placed on each pin 12 while its back face 5c and bevel portion 5d are exposed.

Next, hydrophobic treatment is applied to the wafer 5 housed in the chamber 11. Specifically, hydrophobic treatment is selectively applied to the back face 5c and the bevel portion 5d of the wafer 5. After the wafer 5 is housed in the chamber 11, the atmosphere in the chamber 11 is evacuated from the exhaust port 17 to set the inside of the chamber 11 at a negative pressure. Concurrently, a temperature of the hot plate 13 is adjusted such that a temperature of the back face 5c of the wafer 5 is in the range of about 80° C. or more and 200° C. or less. In the embodiment, a gas between the back face 5c of the wafer 5 and a surface (top face) of the hot plate 13 is set at about 3 mm.

Under such a design, the hydrophobic atmosphere described previously is introduced into the chamber 11 via the hydrophobic treating agent inlet port 15, so that a hydrophobic treatment is started. As the hydrophobic treating agent 22, it is desirable to use a silane coupling agent represented by hexamethyl disilazane (HMDS) or the like. In the embodiment, hexamethyl disilazane (HMDS) is used as the hydrophobic treating agent 22. Therefore, bubbling is carried out with respect to the HMDS 22 supplied from the chemical bottle 21 into the bubbling container 23 to produce the atmosphere including the HMDS 22. Then, the atmosphere including the HMDS 22 is introduced into the chamber 11 via the hydrating processing agent inlet port 15. As the hydrophobic treating agent, a fluorocarbon-based treating agent other than the HMDS 22 may be used.

Thereafter, hydrophobic treatment is carried out at a predetermined temperature for a predetermined time. Specifically, it is desirable to set a temperature of the wafer 5 to be brought into contact with the hydrophobic treating agent (HMDS) 22 at a temperature ranging from a room temperature to about 200° C. The temperature of the wafer 5 may be determined in consideration of, for example, a reaction temperature of the hydrophobic treating agent 22 and a heat resistance of various coating films provided on the wafer 5. It is desirable that a time required for hydrophobic treatment is in the range of about 10 seconds to 300 seconds. In this manner, the hydrophobic treatment according to the embodiment is carried out by bringing water steam including the HMDS 22 into contact with the wafer 5.

After hydrophobic treatment completes, an atmosphere including the HMDS 22 is evacuated to the outside of the chamber 11 via the exhaust port 17. Subsequently, high purity $N_2$ is introduced into the chamber 11 via the intake port 16. After it is verified that replacement of the hydrophobic atmosphere in the chamber 11 has been sufficiently carried out, a shutter (not shown) of the chamber 11 is opened. Then, the wafer 5 applied with hydrophobic treatment is removed from the inside of the chamber 11.

In the present embodiment, it is desirable to apply hydrophobic treatment such that a contact angle of pure water with respect to the wafer 5 applied with hydrophobic treatment is equal to or greater than about 45°. In particular, it is desirable to apply hydrophobic treatment such that a contact angle of pure water with respect to the back face 5c and the bevel portion 5d of the wafer 5 applied with hydrophobic treatment is equal to or greater than 60°.

Next, as shown in FIG. 5B, an antireflection film 31 is provided on the surface 5a of the wafer 5 applied with hydrophobic treatment. The antireflection film 31 is formed in accordance with a spin coat method by using, for example, a coating device (not shown). That is, a coating material for the antireflection film is dropped at the center part of the surface 5a of the rotating wafer 5, the dropped material is spread on the whole surface 5a, and then, heat treatment is carried out. As a consequence, the antireflection film 31 is formed on the surface 5a of the wafer 5. In the embodiment, the antireflection film 31 having a film thickness of about 80 nm is formed on the surface 5a of the wafer 5.

Next, as shown in FIG. 5B, a resist film 32 is formed on the surface of the antireflection film 31. In the embodiment, an ArF chemical amplification type resist film including an acid generator agent is employed as the resist film 32. The resist film 32 is formed in the same manner as the antireflection film 31. That is, the coating material for the chemical amplification type resist film 32 is spread on the antireflection film 31 in accordance with a spin coat method. Subsequently, a solvent included in the coating material is vaporized and eliminated by applying heat treatment to the wafer 5 having the coating material for the chemical amplification type resist 32 provided thereon. In this manner, the ArF chemical amplification type resist film 32 is formed on the surface of the antireflection film 31. In the embodiment, the ArF chemical amplification type resist film 32 having a film thickness of about 230 nm is provided on the surface 5a of the wafer 5.

Next, as shown in FIG. 5B, a liquid immersion exposure cover film 33 that is soluble in a developer is formed on the surface of the ArF chemical amplification type resist film 32. The cover film 33 is also formed in accordance with rotating coating and heat treatment, as in the antireflection film 31 and the ArF chemical amplification type resist film 32.

The wafer 5 having undergone the above process is shown in FIGS. 5A and 5B. FIG. 5A is a plan view showing the wafer 5 having the antireflection film 31, the ArF chemical amplification type resist film 32, and the cover film 33 formed thereon, as seen from the back face 5c. FIG. 5B is a sectional view showing the wafer 5 having the antireflection film 31, the ArF chemical amplification type resist film 32, and the cover film 33 formed thereon.

As shown in FIGS. 5A and 5B, a hydrophobic-treated section 34 fully applied with hydrophobic treatment is formed on the back face 5c of the wafer 5 such that a contact angle with pure water becomes about 60°. In addition, as shown in FIG. 5B, a hydrophobic-treated section 34 is also formed at each of a side part and a bottom face part of the bevel portion 5d of the peripheral rim part (edge part) 5b of the wafer 5. The antireflection film 31 is formed without overlapping the hydrophobic-treated section 34 while covering the surface 5a of the wafer 5 and a top face part of the bevel portion 5d of the wafer 5. Similarly, the resist film 32 is also formed without overlapping the hydrophobic-treated section 34 while covering the antireflection film 31. The cover film 33 is formed with respect to each of the films 31 and 32 while covering part of the hydrophobic-treated section 34. Specifically, the cover film 33 is formed while covering the hydrophobic-treated section 34 formed on the antireflection film 31, the resist film 32, and the side face part of the bevel portion 5d of the wafer 5.

Next, liquid immersion exposure treatment is applied to the wafer 5 having the antireflection film 31, the ArF chemical amplification type resist film 32, and the cover film 33. First, the wafer 5 having the coating films 31, 32, and 33 formed thereon is transported from the coating device to the liquid immersion type exposure apparatus 1 described previously. Then, the wafer 5 is placed on a wafer stage 6 of the exposure apparatus 1, and is held by a support plate 7. Subsequently, alignment and alignment exposure are carried out for the wafer 5. Then, in accordance with liquid immersion exposure, a semiconductor element pattern (reticle pattern), although not shown, formed on the reticle 2, is transferred to the resist film 32 to form a latent image.

Next, the wafer 5 having such a latent image of a semiconductor element pattern formed thereon is removed from the top of the stage 6, and is transported from the exposure apparatus 1 into a chamber for post exposure baking (not shown). Then, heat treatment (PEB) is applied to the wafer 5 at about 130° C. for about 60 seconds. This heat treatment promotes a dispersion reaction and an amplification reaction of an acid generated in the resist film in a liquid immersion exposure process (liquid immersion exposure step).

Next, developing treatment is applied to the wafer 5 applied with PEB. First, the wafer 5 applied with PEB is removed from the inside of the PEB chamber, and the liquid immersion exposure cover film 33 is released and eliminated from the top of the resist film 32. Subsequently, the wafer 5 having the cover film 33 removed therefrom is transported to a developing treatment unit (not shown).

When the wafer 5 is transported upward of a cup of the developing treatment unit that holds the wafer 5, a pin first rises, so that the wafer 5 is received. Then, the wafer 5 is placed on a spin chuck to be vacuum-adsorbed. Subsequently, a nozzle that is standby at a nozzle standby position ejects the developer toward the wafer 5 while the nozzle moves above the wafer 5. In this manner, the developer is applied onto the wafer 5 to perform developing. Here, developing is carried out while the wafer 5 is made still for about 30 seconds. After developing, pure water is supplied onto the wafer 5 to wash out the developer. Then, the wafer 5 is rotated, thereby carrying out swinging dry treatment. As a consequence, a semiconductor element pattern (resist pattern), although not shown, is formed on the resist film 32.

Thereafter, although a detailed and specific description with illustration is omitted, the wafer 5 having a resist pattern formed thereon is fed to a predetermined processing step. That is, the wafer 5 having a resist pattern formed thereon is fed to another Front End Of the Line (FEOL) such as a transistor manufacturing process or a wiring forming process. Subsequently, the wafer 5 having undergone FEOL is fed to a Back End Of the Line (BEOL) such as dicing, chip mounting, bonding, and molding. Undergoing the BEOL provides a desired semiconductor device (not shown) according to the present embodiment. That is, there is obtained a semiconductor device comprising the wafer 5 on which hydrophobic treatment is applied to the back face 5d and the bevel portion 5d by the hydrophobic treatment apparatus 10 prior to forming the resist film 32.

In addition, although a detailed and specific description with illustration is not shown, the inventors executed a prototype experiment of forming wiring on the wafer 5 having undergone each process. More specifically, a wiring pattern was formed on the wafer 5 fabricated through the processes while the resist film 32 is used as a mask. As a result, a defect such as pattern short-circuit was not found. A wiring pattern with its high dimensional precision and good pattern shape can be obtained as compared with a case of using a conventional wafer that is not applied with hydrophobic treatment. That is, the present embodiment can provide a semiconductor device having high device reliability, quality, and performance etc. as compared with a semiconductor device of a prior art. Concurrently, such a semiconductor device can be manufactured efficiently and easily at a high yield.

Now, with reference to FIG. 6, a description will be given with respect to Comparative Example of the present embodiment. FIG. 6 is a sectional view showing a wafer 101 according to Comparative Example of the embodiment.

The wafer 101 is not applied with hydrophobic treatment, unlike the above-described wafer 5 of the embodiment. An antireflection film 102 is formed while covering a surface 101a and a top face part of a bevel portion 101d of the wafer 101. A resist film 103 is formed while covering the antireflection film 102. A cover film 104 is formed while covering the antireflection film 102, the resist film 103 and a side face part of the bevel portion 101d of a peripheral rim part (edge part) 101b of the wafer 101.

The inventors performed liquid immersion exposure treatment to the wafer 101 having such a constitution by using the liquid immersion exposure apparatus 1 as in the present embodiment. Then, after liquid immersion exposure treatment, the wafer 101 was removed from the liquid immersion exposure apparatus 1 and observed. Then, as shown in FIG. 6, water droplets of a liquid immersion solution (pure water) 105 were deposited to a back face 101c and a bottom face part of the bevel portion 101d of the wafer 101, and were in a wet state.

As described in the Description of the Related Art section, a danger of deteriorating quality of the wafer 101 becomes very high if pure water 10 is rounded at the back face 101c of the wafer 101, and is in a wet state. Finally, there is a high danger that a semiconductor device manufactured using the quality-degraded wafer 101 is lowered in its performance, quality, reliability and the like.

In contrast, the wafer 5 according to the embodiment is constituted so that, as described previously, hydrophobic treatment is applied to the back face 5c and the bevel portion 5d by the hydrophobic treatment apparatus 10 prior to providing the resist film 32. For this reason, as shown in FIG. 5B, in the wafer 5 having completed liquid immersion exposure, water droplets are hardly adhered to the top of the back face 5c and the top of the bevel portion 5d as well as the top of the surface 5a. Accordingly, there is almost no danger that the wafer 5 deteriorates in its quality even if liquid immersion exposure is applied to the wafer 5. Finally, there is almost no danger that the performance, quality, reliability and the like of the semiconductor device according to the embodiment manufactured using the wafer 5 are lowered. Although not shown, of course, hydrophobic treatment is applied to the surface 5a of the wafer 5, according to the previously described hydrophobic treatment.

Now, a description will be given with respect to a reason for performing hydrophobic treatment prior to forming the resist film 32.

What liquid immersion exposure is, in general, applied is a generation that follows a so-called Deep UV lithography process such as a KrF excimer laser lithography process and an ArF excimer laser lithography process. A resist film called a chemical amplification type resist film is used for a lithography process of this generation. For example, a reaction mechanism in an exposure process for the chemical amplification type resist film of a positive type is as described below. First, when a resist film is exposed, a photoacid generator agent included in the resist film generates an acid. The generated acid decomposes after reacting with a catalyst being a functional group referred to as a reaction inhibition group that exists in the resist film. Consequently, a resist film of an exposed portion becomes soluble to a developer.

In the hydrophobic treatment process described previously, a hydrophobic treating agent such as hexamethyl disilane is used. However, in this case, a basal substance such as ammonia may be generated as a byproduct in the resist film. If a byproduct made of a basal substance is generated in the resist film, the byproduct inhibits a catalytic reaction of the chemical amplification type resist. Finally, the byproduct causes a shape failure of the resist pattern.

Therefore, as described previously, hydrophobic treatment for the wafer 5 must be carried out prior to forming the resist film 32 on the wafer 5. In addition, it becomes possible to eliminate a byproduct generated by hydrophobic treatment from the surface 5a of the wafer 5 on which the resist film 32 is formed, by adding heat treatment or the like.

As has described above, according to the first embodiment, hydrophobic treatment is applied to at least the back face 5c and the bevel portion 5d of the wafer 5 prior to forming the resist film 32 on the wafer 5. In this manner, even if an immersion liquid is rounded from the surface 5a to the back face 5c of the wafer 5 due to liquid immersion exposure, the back face 5c and bevel portion 5d of the wafer 5 can be restricted from being wet. Accordingly, there is almost no danger that the wafer 5 deteriorates in its quality even if liquid immersion exposure is applied to the wafer 5. Finally, there is almost no danger that the semiconductor device manufactured using the wafer 5 deteriorates in its performance, quality, reliability and the like.

Second Embodiment

Now, a second embodiment according to the present invention will be described with reference to FIGS. 7A and 7B. FIGS. 7A and 7B are respectively a plan view and a sectional view showing a substrate applied with substrate processing according to the second embodiment, as seen from a back face. Like constituent elements in the first embodiment are designated with like reference numerals, and a detailed description is omitted here.

In the second embodiment, unlike the first embodiment described above, hydrophobic treatment is not applied to the whole back face 5c of the wafer 5. In the second embodiment, hydrophobic treatment is selectively applied to a region enclosed in a predetermined range from the peripheral rim part 5b, of the back face 5c of the wafer 5. Now, a specific and detailed description will be given below.

First, in the second embodiment, as indicated by the dashed line shown in FIG. 2, a hydrophobic treating agent shielding mechanism 14 is installed while covering the center part 5e of the back face 5c of the wafer 5. The hydrophobic treating agent shielding mechanism 14 is located at a position opposite to the center part 5e of the back face 5c of the wafer 5 in the chamber 11 of the hydrophobic treatment apparatus 10 for use in the first embodiment. That is, the hydrophobic treating agent shielding mechanism 14 is installed at the periphery of the hot plate 13. The hydrophobic treating agent shielding mechanism 14 is specifically provided as a shielding plate having a width of 3 mm. Concurrently, a plurality of spacer members (gap spacers) 41 having a size of about 100 μm are provided on a main face at a side of the shielding plate 14 opposite to a back face 5c of the wafer 5. The wafer 5 housed in the chamber 11 is placed on each of the gap spacers 41 arranged between these shielding plate 14 and the back face 5c of the wafer 5. In this manner, a hydrophobic atmosphere is inhibited from coming into contact with the center part 5e of the back face 5c of the wafer 5. Under such a design, hydrophobic treatment is applied to the wafer 5 in the same manner as in the first embodiment. In the second embodiment, hydrophobic treatment is applied to the wafer 5 at about 100° C. for about 10 seconds. Other processes are similar to those according to the first embodiment.

The wafer 5 having undergone the above process is shown in FIGS. 7A and 7B. FIG. 7A is a plan view showing the wafer 5 having the antireflection film 31, the ArF chemical amplification type resist film 32, and the cover film 33 formed thereon, as seen from the back face 5c. FIG. 7B is a sectional view showing the wafer 5 the antireflection film 31, the ArF chemical amplification type resist film 32, and the cover film 33 formed thereon.

As shown in FIGS. 7A and 7B, hydrophobic treatment is applied to a region excluding its center part 5e, so that a hydrophobic-treated section 34 is formed on the back face 5c of the wafer 5. However, as shown in FIG. 7, as in the first embodiment, a hydrophobic-treated section 34 is formed at a side part and a bottom face part of the bevel portion 5d at the peripheral rim part (edge part) 5b of the wafer 5. Then, as shown in FIG. 7B, the antireflection film 31, the resist film 32, and the cover film 33 are formed in constitution similar to that according to the first embodiment.

In a general liquid immersion type exposure apparatus, including the liquid immersion type exposure apparatus used in the first embodiment, a water discharge device (water absorption mechanism) for removing an immersion liquid from a wafer stage is provided at a portion adjacent to an edge part of a wafer on the wafer stage. Thus, while at least liquid immersion exposure is carried out, there is almost no danger that a center part of a back face of the wafer comes into contact with an immersion liquid. Accordingly, unlike the first embodiment, it is not always necessary to fully apply hydrophobic treatment to the back face 5c of the wafer 5. It suffices that hydrophobic treatment is applied to a region and its outside of the back face 5c and peripheral rim part 5b of the wafer 5, in which water absorption of an immersion liquid is carried out by the water adsorption mechanism. That is, as in the present embodiment, it suffices that hydrophobic treatment is applied to the peripheral rim part 5b of the back face 5c of the wafer 5 and the bevel portion 5d of the wafer 5 excluding the center part 5e, of at least the back face 5c of the wafer 5.

As has been described above, according to the second embodiment, advantageous effect similar to the above-described first embodiment can be obtained.

Third Embodiment

Figure 8:
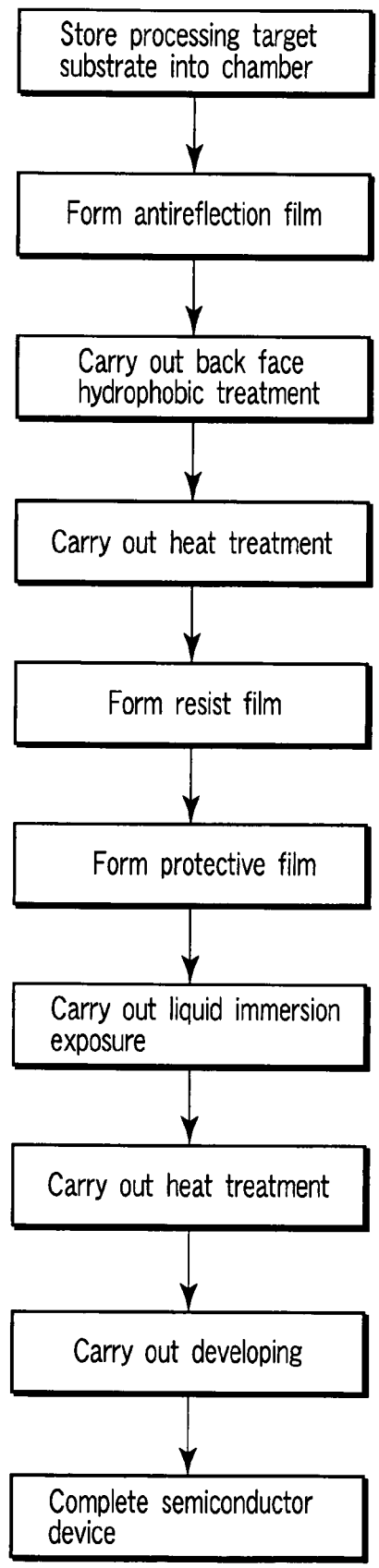
FIG. 8 is a flow chart showing a substrate processing method according to a third embodiment.

Now, a third embodiment according to the present invention will be described with reference to FIG. 8. FIG. 8 is a flow chart showing a substrate processing method according to the third embodiment. Like constituent elements in the first and second embodiments are designated by like reference numerals, and a detailed description is omitted here.

In the third embodiment, unlike the first and second embodiments, an antireflection film 31 is formed on a surface 5a of the wafer 5 prior to applying hydrophobic treatment to the wafer 5. Now, a brief description will be given below.

As shown in FIG. 8, unlike the first and second embodiments, the organic antireflection film 31 is provided on the surface 5a of the wafer 5 prior to applying hydrophobic treatment to the wafer 5 in the present embodiment. Then, hydrophobic treatment is applied to the wafer 5 having the organic antireflection film 31 formed thereon. Further, prior to forming a resist film 32 on the organic antireflection film 31, heat treatment is applied to the wafer 5 applied with hydrophobic treatment. Other processes are identical to those according to the first embodiment.

As has been described in the first embodiment, in the case where hydrophobic treatment is applied to the wafer 5, care must be taken for the generation of a byproduct due to the hydrophobic treatment. That is, there is a need for taking an account into contamination of the organic antireflection film 31 due to a byproduct. If the organic antireflection film 31 is contaminated by the byproduct, there is a high danger that a failure occurs with a shape of a resist pattern when the resist pattern is formed on the resist film formed on the organic antireflection film 31. In order to restrict a shape failure of such a resist pattern, a contamination substance may be removed from the inside of the organic antireflection film 31 prior to forming the resist film 32 on the organic antireflection film 31. In the third embodiment, as shown in FIG. 8, heat treatment is applied to the wafer 5 applied with hydrophobic treatment, prior to forming the resist film 32 on the organic antireflection film 31. As a consequence, contamination substances (impurities) that cause a shape failure of a resist pattern are removed in advance from the inside of the antireflection film 31, prior to forming the resist film 32 on the organic antireflection film 31.

A detailed and specific description with illustration is not shown. According to embodiment carried out by the inventors, a prototype test for forming wiring on the wafer 5 fabricated by the present embodiment was carried out. That is, with respect to the wafer 5 fabricated through the processes shown in FIG. 8, a wiring pattern was formed with the resist film 32 being a mask. As a result, a defect such as a pattern short-circuit was not found. Successfully, a wiring pattern having high dimensional precision and good pattern shape could be obtained as compared with a case of using a conventional wafer that is not applied with hydrophobic treatment.

As has been described above, according to the third embodiment, it is possible to attain an advantageous effect that is similar to those according to the first and second embodiments.

The substrate processing method and substrate processing apparatus according to the invention are not restricted to those in the first to third embodiments. Without deviating from the spirit of the present invention, part of these constituent elements or manufacturing steps can be changed to a variety of settings or various setting can be provided using them in proper combination.

For example, hydrophobic treatment relevant to the wafer 5 is not always limited to gaseous hydrophobic treatment atmosphere (hydrophobic treatment evaporation) including the hydrophobic treating agent 22. Instead of a gaseous hydrophobic treatment atmosphere, a liquid containing the hydrophobic treating agent 22 may be directly supplied to a portion of the wafer 5 that requires hydrophobic treatment.

The hydrophobic treating agent 22 is not always limited to a silane coupling agent represented by hexamethyl disilane (HMDS) or the like. As the hydrophobic treating agent 22, for example, an organic silicon compound or a fluorocarbon-based compound may be used.

In addition, heat treatment (PEB) relevant to the wafer 5 applied with hydrophobic treatment does not always need to be carried out at about 130° C. It suffices that heat treatment relevant to the wafer 5 applied with hydrophobic treatment is carried out at about 100° C. or more.

The gap (proximal distance) between the shielding plate 14 and the back face 5c of the wafer 5 in the second embodiment is not always limited to about 100 μm. The gap between the shielding plate 14 and the back face 5c of the wafer 5 may be equal to or smaller than about 500 μm. That is, the gap between the shielding plate 14 and the back face 5c of the wafer 5 may be set in size such that a hydrophobic treating agent can come into contact with the center part 5e of the back face 5c of the wafer 5. As long as the gap between the shielding plate 14 and the back face 5c of the wafer 5 is equal to or smaller than about 500 μm, the back face 5c of the wafer 5 may be properly made proximal to the shielding plate 14 at a proper gap. Alternatively, the back face 5c of the wafer 5 may be brought into contact with the shielding plate 14. That is, the gap between the shielding plate 14 and the back face 5c of the wafer 5 may be 0 μm. In addition, adjustment of the gap between the shielding plate 14 and the back face 5c of the wafer 5 is not always limited to a method for providing the gap spacer 41 formed in advance in desired size on the upper part of the shielding plate 14, as described previously. The gap between the shielding plate 14 and the back face 5c of the wafer 5 may be adjusted such that, for example, each pin 12 is movable in a longitudinal direction (vertical direction), or may be set by elevating each of these pins.

Portions to be applied with hydrophobic treatment are not limited to the portions described previously. It suffices that hydrophobic treatment is applied to at least one of the bevel portion 5d and the back face 5c that is outer than a film (coat film) for coating the outermost part of at least the outer periphery part of the wafer 5. Specifically, assume that a wiring pattern or the like is subjected to liquid immersion exposure by using the liquid immersion exposure apparatus 1 with respect to the resist film 32 of the wafer 5 on which the surface 5a of the wafer 5 that is a main face at a side having a semiconductor element formed thereon is approximately covered with various coat films such as the antireflection film 31, the resist film 32, and the liquid immersion cover film 33. In this case, it suffices that the back face 5c of the wafer 5 that is not covered with a coat film is hydrophobized in advance. In addition, when the wafer 5 is held in a process other than the hydrophobic treatment process, such as a liquid immersion exposure process, it is desirable that a holding mechanism for holding the wafer 5 should not come into contact with a region of the wafer 5 applied with hydrophobic treatment.

A film structure on the wafer 5 is not limited to the structure described previously. For example, after a hard mask composed of an inorganic film for processing the wafer 5 is first formed on the wafer 5, an organic antireflection film 31 may be formed thereon. In this case, hydrophobic treatment may be carried out after the hard mask is formed.

In addition, a structure of the resist film 32 is not limited to the single-layered structure described previously. For example, after a lower layer resist film and an intermediate resist film are properly formed on the wafer 5, a resist film having a multi-layered structure may be provided on the wafer 5 in accordance with a multi-layered resist process for forming an upper-layered resist film. In this case, it is desirable to carry out hydrophobic treatment before any one of the process for forming a lower-layered resist film, the process for forming a intermediate resist film, and the process for forming an intermediate resist film, and the process for forming an upper-layered resist film. As required, it is desirable to add heat treatment as additional processing before any one of these processes, as in the third embodiment in which the organic antireflection film 31 is provided on the wafer 5 prior to carrying out hydrophobic treatment.

Further, either of an organic film and an inorganic film may be used as the antireflection film 31. Concurrently, the antireflection film 31 may be formed in a multi-layered structure such that a same type or different type of reflection film films are formed in a plurality of layers.

In the case where an inorganic antireflection film such as a SiON film formed in accordance with a chemical vapor deposition (CVD) method is used as the antireflection film 31, the inorganic antireflection film is occasionally formed on the back face 5c of the wafer 5. In this case, liquid immersion exposure is carried out with the back face 5c of the wafer 5 covered with an inorganic antireflection film. In such a case, hydrophobic treatment for the wafer 5 needs to be carried out after forming an inorganic antireflection film and before forming a resist film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing method comprising:
   while a liquid is supplied between a processing target substrate to be applied with exposure treatment and a projection optical system of an exposure apparatus for carrying out the exposure treatment, prior to providing a resist film on a first main face of the processing target substrate that is provided for liquid immersion exposure for carrying out the exposure treatment at a side to be applied with the exposure treatment, selectively applying at least hydrophobic treatment with respect to a region in a predetermined range from a peripheral rim part of a second main face opposite to the first main face.

2. The method according to claim 1, wherein the hydrophobic treatment is applied to a region excluding a center part of the second main face.

3. The method according to claim 1, wherein a hydrophobic treating agent for use in the hydrophobic treatment is an organic silicon compound.

4. The method according to claim 1, wherein a hydrophobic treating agent for use in the hydrophobic treatment is a fluorocarbon-based compound.

5. The method according to claim 1, wherein a liquid containing a hydrophobic treating agent for use in the hydrophobic treatment is supplied to the second main face of the processing target substrate, or the second main face of the processing target substrate is exposed to a gas containing the hydrophobic treating agent, thereby carrying out the hydrophobic treatment.

6. The method according to claim 1, wherein the hydrophobic treatment is carried out while heat treatment is applied to the processing target substrate at a temperature of 80° C. or more and 200° C. or less.

7. The method according to claim 1, further comprising:
   applying heat treatment to the processing target substrate at a temperature equal to or greater than 100° C. after carrying out the hydrophobic treatment.

8. The method according to claim 1, wherein the resist film does not overlap the region where the hydrophobic treatment is applied.

9. A manufacturing method of a semiconductor device wherein the method including a liquid immersion exposure method for carrying out exposure treatment while supplying a liquid between a processing target substrate to be applied with the exposure treatment and a projection optical system of an exposure device for carrying out the exposure treatment, comprising:
   providing a resist film on which a predetermined resist pattern is formed by the exposure treatment on a first main face of the processing target substrate at a side to be applied with the exposure treatment;

providing a cover film on the resist film; and selectively applying the exposure treatment via a mask to the processing target substrate having the cover film provided thereon, and prior to providing the resist film on the first main face, selectively applying at least hydrophobic treatment to a region in a predetermined range from a peripheral rim part of a second main face opposite to the first main face of the processing target substrate.

10. The method according to claim 9, wherein the hydrophobic treatment is applied to a region excluding a center part of the second main face.

11. The method according to claim 9, wherein a hydrophobic treating agent for use in the hydrophobic treatment is an organic silicon compound.

12. The method according to claim 9, wherein a hydrophobic treating agent for use in the hydrophobic treatment is a fluorocarbon-based compound.

13. The method according to claim 9, wherein a liquid containing a hydrophobic treating agent for use in the hydrophobic treatment is supplied to the second main face of the processing target substrate, or the second main face of the processing target substrate is exposed to a gas containing the hydrophobic treating agent, thereby carrying out the hydrophobic treatment.

14. The method according to claim 9, wherein the hydrophobic treatment is carried out while heat treatment is applied to the processing target substrate at a temperature of 80° C. or more and 200° C. or less.

15. The method according to claim 9, further comprising:
applying heat treatment to the processing target substrate at a temperature equal to or greater than 100° C. after carrying out the hydrophobic treatment.

16. The method according to claim 9, wherein the resist film does not overlap the region where the hydrophobic treatment is applied.

17. A manufacturing method of a semiconductor device wherein the method including a liquid immersion exposure method for carrying out exposure treatment while supplying a liquid between a processing target substrate to be applied with the exposure treatment and a projection optical system of an exposure device for carrying out the exposure treatment, comprising:

providing a resist film on which a predetermined resist pattern is formed by the exposure treatment on a first main face of the processing target substrate at a side to be applied with the exposure treatment;

providing a cover film on the resist film; and selectively applying the exposure treatment via a mask to the processing target substrate having the cover film provided thereon, and prior to providing the resist film on the first main face, selectively applying at least hydrophobic treatment to a region in a predetermined range from a peripheral rim part of a second main face opposite to the first main face of the processing target substrate by use of a substrate processing apparatus, the substrate processing apparatus comprising:

a substrate housing chamber in which a processing target substrate to be applied with exposure treatment is housed prior to providing a resist film on a first face at a side to be applied with the exposure;

a substrate support unit which exposes a region in a predetermined range from a peripheral rim part of a second main face opposite to at least the first main face in the substrate housing chamber, and supports the processing target substrate; and a substrate treating agent supply device which supplies a hydrophobic treating agent into the substrate housing chamber.

18. The method according to claim 17, wherein the resist film does not overlap the region where the hydrophobic treatment is applied.

\* \* \* \* \*